(12) United States Patent
Song et al.

(10) Patent No.: US 7,541,682 B2
(45) Date of Patent: *Jun. 2, 2009

(54) SEMICONDUCTOR CHIP HAVING BOND PADS

(75) Inventors: Young-Hee Song, Kyunggi-do (KR); Il-Heung Choi, Kyunggi-do (KR); Jeong-Jin Kim, Chungcheongnam-Do (KR); Hae-Jeong Sohn, Kyunggi-Do (KR); Chung-Woo Lee, Kyunggi-Do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/556,153

(22) Filed: Nov. 2, 2006

(65) Prior Publication Data

US 2007/0057383 A1 Mar. 15, 2007

Related U.S. Application Data

(60) Continuation of application No. 10/651,813, filed on Aug. 28, 2003, now Pat. No. 7,148,578, which is a division of application No. 10/192,800, filed on Jul. 9, 2002, now Pat. No. 6,642,627.

(30) Foreign Application Priority Data

| Jul. 10, 2001 | (KR) | ............................ 2001-0041154 |
| Jan. 18, 2002 | (KR) | ............................ 2002-0003030 |

(51) Int. Cl.
*H01L 23/48* (2006.01)
*H01L 23/52* (2006.01)
*H01L 23/495* (2006.01)
*H01L 23/525* (2006.01)
*H01L 25/065* (2006.01)

(52) U.S. Cl. .......... 257/786; 257/E23.02; 257/E23.052; 257/E23.146; 257/E23.013; 257/666; 257/E25.013; 257/780; 257/E23.039; 257/E25.012; 257/723; 257/724; 257/725; 257/784; 257/301; 257/302; 257/754; 257/760; 257/315

(58) Field of Classification Search .................. 257/786, 257/E23.02, E23.052, E23.146, E23.013, 257/666, E25.013, 780, E23.039, E25.012, 257/723, 724, 725, 784, 301, 302, 754, 760, 257/315

See application file for complete search history.

(56) References Cited

U.S. PATENT DOCUMENTS 4,723,197 A 2/1988 Takiar et al.

(Continued)

FOREIGN PATENT DOCUMENTS

DE 19610302 A1 10/1996

(Continued)

OTHER PUBLICATIONS

English language abstract for Japanese Publication No. 06-275794.
English language abstract for Japan Patent Publication No. 08-340002.

(Continued)

*Primary Examiner*—Alexander O Williams
(74) *Attorney, Agent, or Firm*—Harness, Dickey & Pierce, P.L.C.

(57) ABSTRACT

A semiconductor chip has one or more peripheral bond pads. The semiconductor chip comprises a semiconductor substrate having a cell region and a peripheral circuit region adjacent to each other. A bond pad-wiring pattern is formed on at least a part of the peripheral region of the semiconductor substrate. A passivation layer is formed on the bond pad-wiring pattern and exposed portions of the semiconductor substrate; a pad-rearrangement pattern disposed over the passivation layer and electrically connected to the bond pad-wiring pattern; and an insulating layer formed over the pad-rearrangement pattern. The insulating layer has an opening therein that exposes a portion of the pad-rearrangement pattern to define a bond pad. The bond pad is disposed over at least a part of the cell region.

14 Claims, 12 Drawing Sheets

U.S. PATENT DOCUMENTS

| | | | |
|---|---|---|---|
| 4,984,050 | A | 1/1991 | Kobayashi |
| 5,365,091 | A | 11/1994 | Yamagishi |
| 5,444,012 | A | 8/1995 | Yoshizumi et al. |
| 5,502,289 | A | 3/1996 | Takiar et al. |
| 5,677,576 | A | 10/1997 | Akagawa |
| 5,723,822 | A | 3/1998 | Lien |
| 5,751,065 | A | 5/1998 | Chittipeddi et al. |
| 5,757,078 | A | 5/1998 | Matsuda et al. |
| 5,834,844 | A | 11/1998 | Akagawa et al. |
| 5,844,304 | A | 12/1998 | Kata et al. |
| 5,886,415 | A | 3/1999 | Akagawa |
| 5,960,308 | A | 9/1999 | Akagawa et al. |
| 5,969,424 | A | 10/1999 | Matsuki et al. |
| 6,008,543 | A | 12/1999 | Iwabuchi |
| 6,103,552 | A | 8/2000 | Lin |
| 6,111,317 | A | 8/2000 | Okada et al. |
| 6,175,149 | B1 | 1/2001 | Akram |
| 6,228,687 | B1 | 5/2001 | Akram et al. |
| 6,239,366 | B1 | 5/2001 | Hsuan et al. |
| 6,383,916 | B1 | 5/2002 | Lin |
| 6,410,414 | B1 | 6/2002 | Lee |
| 6,469,370 | B1 | 10/2002 | Kawahara et al. |
| 6,489,676 | B2 | 12/2002 | Taniguchi et al. |
| 6,498,396 | B1 | 12/2002 | Arimoto |
| 6,503,776 | B2 | 1/2003 | Pai et al. |
| 6,605,528 | B1 | 8/2003 | Lin et al. |
| 6,657,310 | B2 | 12/2003 | Lin |
| 2002/0126459 | A1 | 9/2002 | Albert et al. |
| 2002/0140077 | A1 | 10/2002 | King et al. |
| 2004/0036182 | A1 | 2/2004 | Corisis et al. |
| 2005/0230783 | A1 | 10/2005 | Lin |
| 2006/0033216 | A1 | 2/2006 | Pflughaupt et al. |
| 2007/0057383 | A1* | 3/2007 | Song et al. .................. 257/780 |

FOREIGN PATENT DOCUMENTS

| | | |
|---|---|---|
| EP | 0221496 A2 | 5/1987 |
| EP | 1094517 A2 | 4/2001 |
| JP | 59-181041 | 10/1984 |
| JP | 01-093136 | 4/1989 |
| JP | 04-324958 | 11/1992 |
| JP | 06-275794 | 9/1994 |
| JP | 08-340002 | 12/1996 |
| JP | 09-107048 | 4/1997 |
| JP | 11-040624 | 2/1999 |
| JP | 11-111896 | 4/1999 |
| JP | 11-204576 | 7/1999 |
| JP | 6-275794 | 9/1999 |
| JP | 11-354563 | 12/1999 |
| JP | 2000-031191 | 1/2000 |
| JP | 2000-058743 | 2/2000 |
| JP | 2000-183090 | 6/2000 |
| JP | 2000-294519 | 10/2000 |
| JP | 2001-156172 | 6/2001 |

OTHER PUBLICATIONS

English language abstract for Japanese Patent Publication No. 09-107048.

English language abstract for Japanese Patent Publication No. 11-040624.

English language abstract for Japanese Patent Publication No. 11-111896.

English language abstract for Japanese Patent Publication No. 11-204576.

English language abstract for Japanese Patent Publication No. 2000-031191.

English language abstract for Japanese Patent Publication No. 2000-058743.

English language abstract for Japanese Patent Publication No. 2000-183090.

English language abstract for Japanese Patent Publication No. 2000-294519.

Yasunaga, et al. Chip Scale Package: "A Light Dressed LSI Chip" IEEE transactions on component, packaging and Manufacturing technology part A. Vol. 18, No. 3. Sep. 1995, pp. 451-451.

* cited by examiner

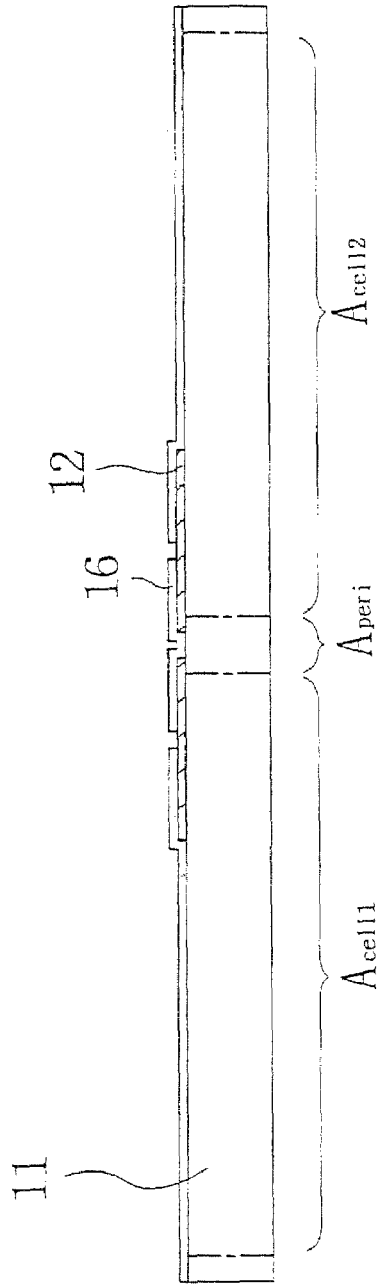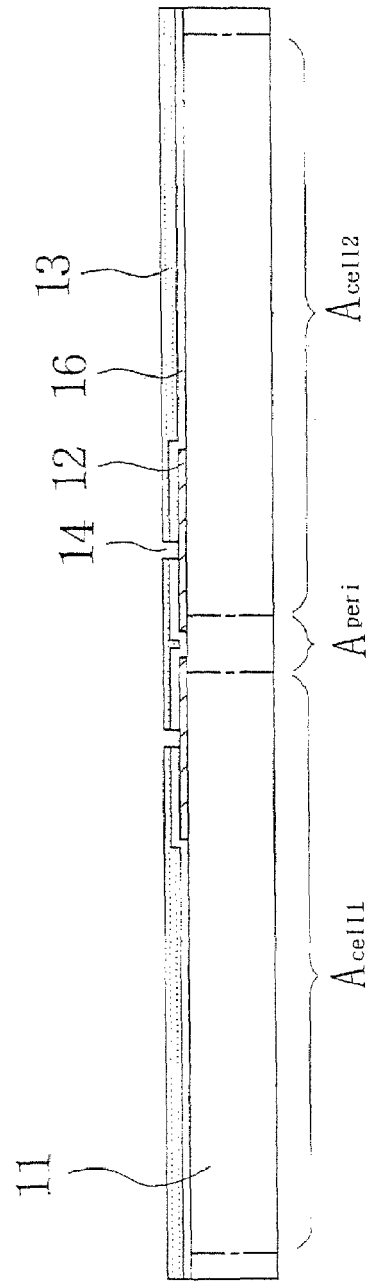

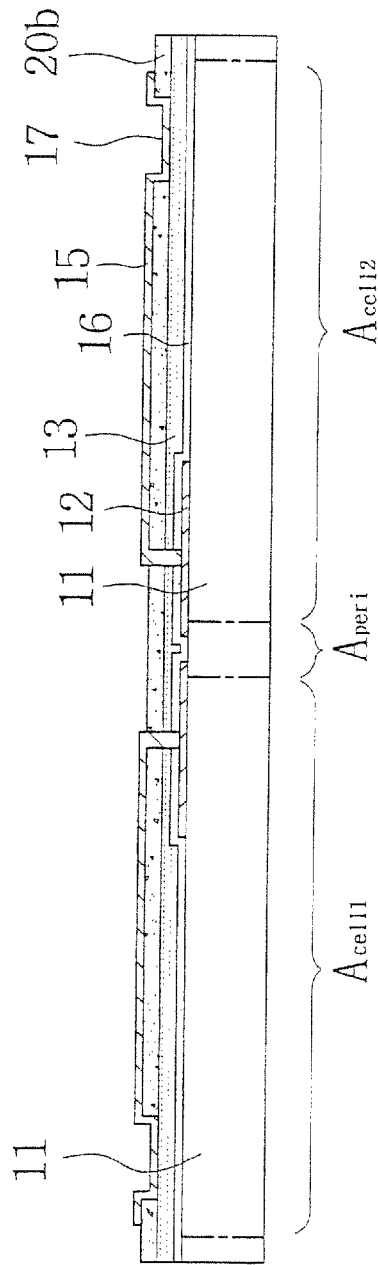
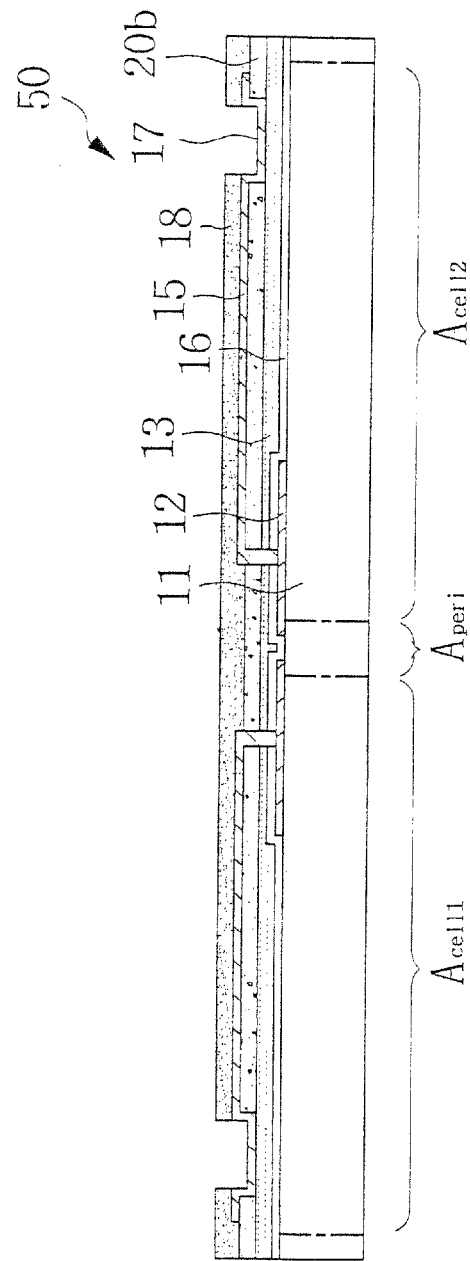

SEMICONDUCTOR CHIP HAVING BOND PADS

CROSS REFERENCE TO RELATED APPLICATIONS

This application is a Continuation of U.S. patent application Ser. No. 10/651,813, filed on Aug. 28, 2003, now issued U.S. Pat. No. 7,148.578, which is a Divisional of U.S. patent application Ser. No. 10/192,800, filed on Jul. 9, 2002, now issued U.S Pat. No. 6,642,627, which claims priority from Korean Patent Application Nos. 2001-0041154, filed on Jul. 10, 2001, and 2002-0003030, filed on Jan. 18, 2002, all of which are herein incorporated by reference in their entirety.

1. Field of the Invention

The present invention relates generally to semiconductor devices and, more particularly, to a semiconductor chip having bond pads and to a multi-chip package (MCP).

2. Description of the Related Art

The industry is expending significant effort toward forming smaller and thinner chips to meet the demand for high packing density in high-speed, multi-functional semiconductor devices. To reduce chip size, the size of bond pads as well as the pitch between bond pads should be reduced.

Conventional semiconductor chips have either a center pad-type or a peripheral pad-type structure. FIG. 1 is a plan view of a conventional center pad-type semiconductor chip. FIG. 2 is a cross-sectional view of the conventional center pad-type chip taken along line 2-2 of FIG. 1. FIG. 3 is a plan view of a conventional peripheral pad-type semiconductor chip. FIG. 4 is a cross-sectional view of the conventional peripheral pad-type chip taken along the line 4-4 of FIG. 3.

Referring to FIGS. 1 and 2, a center pad-type semiconductor chip 110 comprises a peripheral circuit region $A_{peri}$ for forming bond pads 112 and cell regions $A_{cell1}$ and $A_{cell2}$. As is known in the art, different regions of a semiconductor substrate are referred to as a "peripheral circuit region"or a "cell region"based on the structure and/or function of one or more devices formed within (or over) each of the different regions. The peripheral circuit region $A_{peri}$ is formed in the center region of a semiconductor substrate 111. The cell regions $A_{cell1}$ and $A_{cell2}$ are formed on the sides of the peripheral circuit region $A_{peri}$.

Referring to FIGS. 3 and 4, a peripheral pad-type semiconductor chip 120 comprises peripheral circuit regions $A_{peri1}$ and $A_{peri2}$, and a cell region $A_{cell}$. The cell region $A_{cell}$ is formed in the center region of the semiconductor substrate 121. The peripheral circuit regions $A_{peri1}$ and $A_{peri2}$ are formed on the sides of the cell region $A_{cell}$. Referring to FIGS. 2 and 4, a passivation layer 113, 123 is formed over the cell regions and the peripheral circuit regions in both the center and peripheral pad-type chips.

In the conventional semiconductor chips 110, 120 of FIGS. 1 through 4, an additional chip area is needed in peripheral circuit regions for forming bond pads 112, 122. As a result, the ability to reduce the size of the conventional semiconductor chips 110 and 120 is limited in both chip pad types.

Furthermore, it has been difficult to reduce the bond pad size and the pitch between the bond pads 112, 122 in the conventional semiconductor chips 110 and 120. This is because the bond pads 112, 122 must have a designed minimum size and pitch for electric die sorting (EDS) and to form electrical interconnections.

The ability to reduce the size of a multi-chip package (MCP) including multiple conventional semiconductor chips in a single body package is also limited due to problems such as the difficulty of stacking center pad-type chips on chips of the same or similar types. That is, wire bonding can be complicated and difficult due to long loop wires in such cases.

Accordingly, there is a need for a smaller semiconductor chip that can easily form an MCP without suffering from the problems mentioned above.

SUMMARY OF THE INVENTION

In one embodiment, a semiconductor chip has one or more peripheral bond pads. The semiconductor chip comprises a semiconductor substrate having a cell region and a peripheral circuit region adjacent to each other; a bond pad-wiring pattern formed on at least a part of the peripheral region of the semiconductor substrate; a passivation layer formed on the bond pad-wiring pattern and exposed portions of the semiconductor substrate; a pad-rearrangement pattern disposed over the passivation layer and electrically connected to the bond pad-wiring pattern; and an insulating layer formed over the pad-rearrangement pattern. The insulating layer has an opening therein that exposes a portion of the pad-rearrangement pattern to define a bond pad. The bond pad is disposed over at least a part of the cell region.

Thus, with the embodiments of the present invention, the overall chip size can thereby be substantially reduced and an MCP can be fabricated without the problems mentioned above, thus reducing manufacturing costs and increasing productivity.

BRIEF DESCRIPTION OF THE DRAWINGS

The foregoing and other objects, features and advantages of the present invention will be more readily understood through the following detailed description provided with reference to the accompanying figures, wherein like reference numerals designate like structural elements, and, in which:

FIGS. 5 to 8 are cross-sectional views of a semiconductor chip illustrating a process of manufacturing a semiconductor chip according to an embodiment of the present invention;

FIGS. 13 to 15 are cross-sectional views of a semiconductor chip illustrating a process of manufacturing a semiconductor chip according to yet another embodiment of the present invention;

DETAILED DESCRIPTION OF THE PREFERRED EMBODIMENTS

Figure 8:
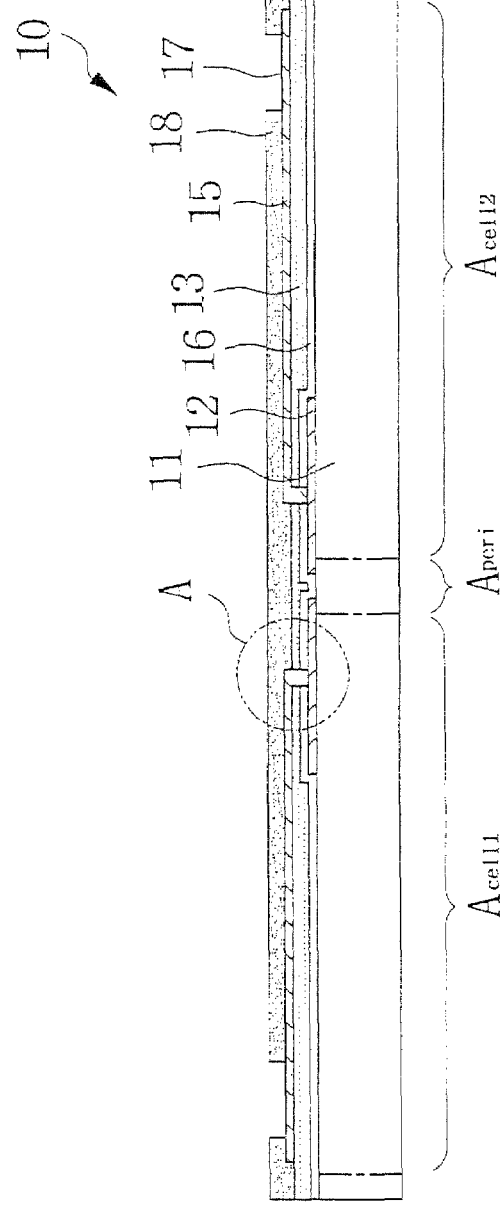

FIG. 8 is a cross-sectional view of a semiconductor clip 10 constructed according to an embodiment of the present invention. Referring to FIG. 8, a semiconductor chip 10 comprises a semiconductor substrate 11 having integrated circuits formed thereon. In particular, the semiconductor substrate 11 includes a peripheral circuit region $A_{peri}$ formed in the center region thereof and cell regions $A_{cell1}$ and $A_{cell2}$ arranged on the sides of the peripheral circuit region $A_{peri}$. A bond pad-wiring pattern 12 is formed in a predetermined area of the substrate 11. The bond pad-wiring pattern 12 can be made of a metal having excellent electrical conductivity, such as aluminum (Al).

The bond pad-wiring pattern 12 is preferably formed in a center region of the semiconductor substrate 11. One end of the bond pad-wiring pattern 12 is preferably formed on the portion of the peripheral circuit region $A_{peri}$. In the conventional semiconductor chip, an additional chip area is needed in peripheral circuit regions for forming bond pads having a minimum size and pitch designed for electric die sorting (EDS) and making electrical interconnections. According to the forgoing embodiment of the present invention, however, no larger additional area for forming bond pads is required, rather only the small portion of the bond pad-wiring pattern 12 needs to be formed on the peripheral circuit region $A_{peri}$. The remaining portion of the bond pad-wiring pattern 12 extends across a portion of the cell region according to an embodiment of the present invention. The width of the semiconductor substrate 11 can therefore be reduced by approximately the width of the bond pad area of the conventional semiconductor chip.

Figure 16:
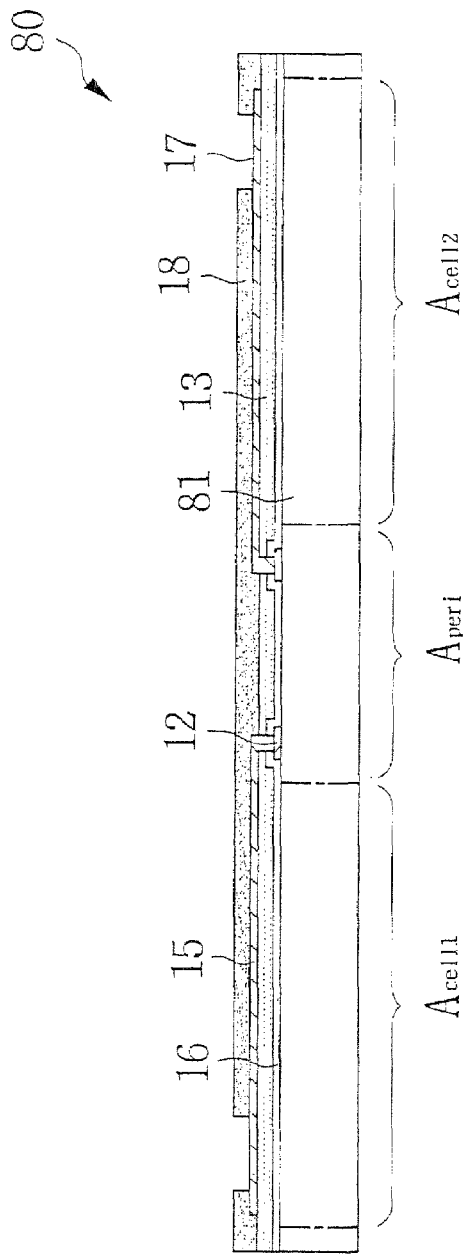
FIG. 16 is a cross-sectional view of a semiconductor chip according to a further embodiment of the present invention.

According to another aspect of the present invention, as shown in FIG. 16, the bond pad-wiring pattern 12 can alternatively be formed entirely within the peripheral circuit region. Also, the bond pad-wiring pattern 12 can be formed entirely within the cell region (although not shown). In these cases, the size of the bond pad-wiring pattern 12 can be made small because a designed minimum size and pitch for electric die sorting (EDS) and electrical interconnections is not needed.

Thus, with the embodiments of the present invention, the overall chip size can thereby be substantially reduced using the above-described principles of the present invention as explained above and further below.

A passivation layer 16 is formed on the bond pad-wiring pattern 12. An interlayer dielectric (ILD) 13 is then formed on the passivation layer 16. The ILD 13 is made of a material having good insulation and integration properties to protect bond pads 17 from mechanical stress due to subsequent wire bonding, beam lead bonding, or ball bonding. For example, a high-density plasma (HDP) oxidized layer, a benzocyclobutene (BCB) layer, a polybenzoxazole (PBO) layer, or a polyimide layer may be used as the ILD 13. An HDP oxide layer using silan, oxygen and argon gases, for example, an HDP-SiO$_2$ layer is preferably used. The passivation layer 16 and the ILD 13 have openings 14 formed therein to expose predetermined portions of the bond pad-wiring pattern 12a.

Figure 10:
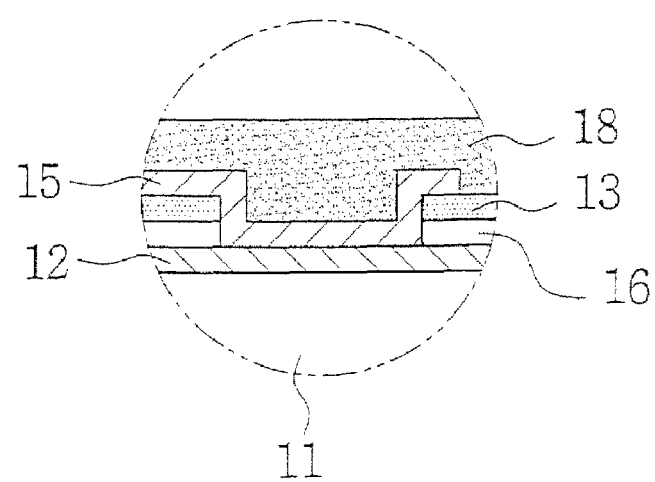
FIG. 10 is an enlarged cross-sectional view of a semiconductor chip illustrating an alternative configuration of portion A of FIG. 8.

A pad-rearrangement pattern 15, having a predetermined layout, is formed on the ILD 13. As shown in portion "A" of FIG. 8, the openings 14 are filled with the pad-rearrangement pattern 15. An alternative configuration of portion A of FIG. 8 is illustrated in FIG. 10. The pad-rearrangement pattern 15 preferably comprises three layers. These three layers can, for example, include a titanium (Ti) layer having a thickness of about 300 to 500 Å, an aluminum (Al) layer having a thickness of about 15,000 Å, and a titanium nitride (TiN) layer having a thickness of about 300 to 500 Å. The pad-rearrangement pattern 15 may be formed of copper (Cu), aluminum (Al), zinc (Zn), iron (Fe), platinum (Pt), cobalt (Co), lead (Pb), nickel (Ni), or an alloy of these elements.

Figure 9:
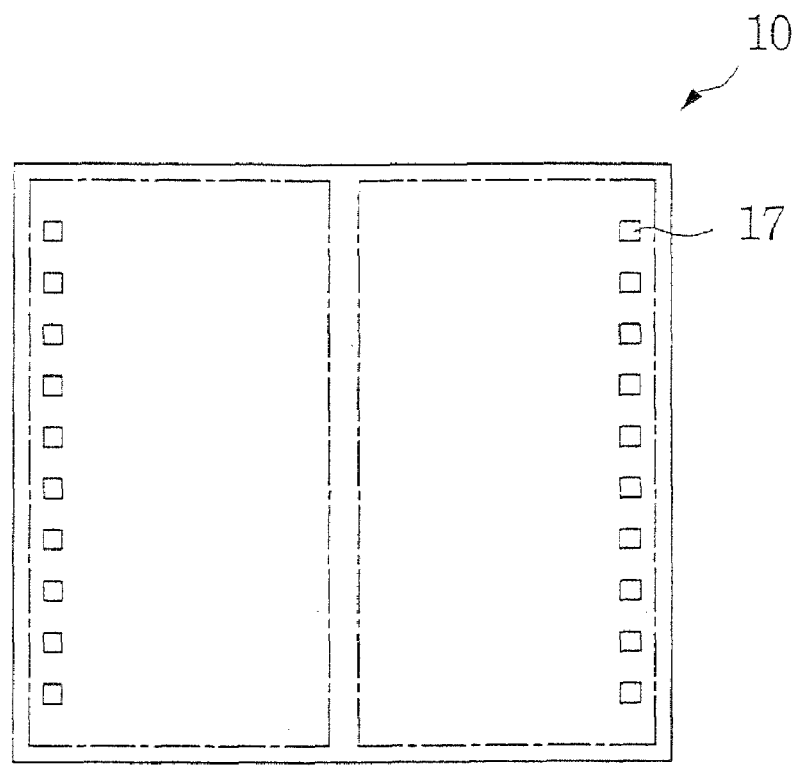
FIG. 9 is a plan view of the semiconductor chip shown in FIG. 8.

An insulating layer 18 is formed on the pad-rearrangement pattern 15. The insulating layer 18 may be an HDP oxide layer such as an HDP-SiO$_2$ layer or an HDP-SiN layer. The insulating layer 18 may further comprise a polyimide layer on the HDP-SiO$_2$ layer so as to protect integrated circuits from alpha particles. A predetermined portion of the pad-rearrangement pattern 15 is exposed through the insulating layer to define the bond pads 17. The bond pads 17 are preferably flush with the pad-rearrangement pattern 15. The bond pads 17 are disposed above at least part of the cell regions $A_{cell1}$, $A_{cell2}$ of the substrate 11. Although the bond pads 17 shown in FIG. 9 are disposed in a single row along opposing edges of the substrate 11, the pads 17 may be disposed along all four edges or in a zigzag shape.

According to one embodiment, the pad-rearrangement pattern 15 reroutes the bond pads 17 from the bond pad-wiring pattern 12 in the peripheral circuit region $A_{peri}$ to above the cell regions $A_{cell1}$ and $A_{cell2}$. As shown above, one end of the pad-rearrangement pattern 15 is electrically connected to the exposed bond pad-wiring pattern 12 via openings 14. The other end extends toward the edge of the substrate 11. In other words, according to one aspect of the present invention, the portion of the pad-rearrangement pattern 12 extends substantially from the center region of the semiconductor substrate 11 toward an edge of the semiconductor substrate 11. The bond pads 17 can therefore be formed along sides of the semiconductor substrate 11. Thus, according to various embodiments of the present invention, peripheral pad type semiconductor chips can be fabricated using center pad type semiconductor chips, which are known to have improved electrical performance characteristics over the peripheral pad type chips. The pitch between the bond pads can increase. During the EDS test, a probe can easily contact the bond pads. These modified peripheral pad chips thus need not be packaged in a lead-on-chip (LOC) type package, but may be implemented in a conventional package.

Figure 11:
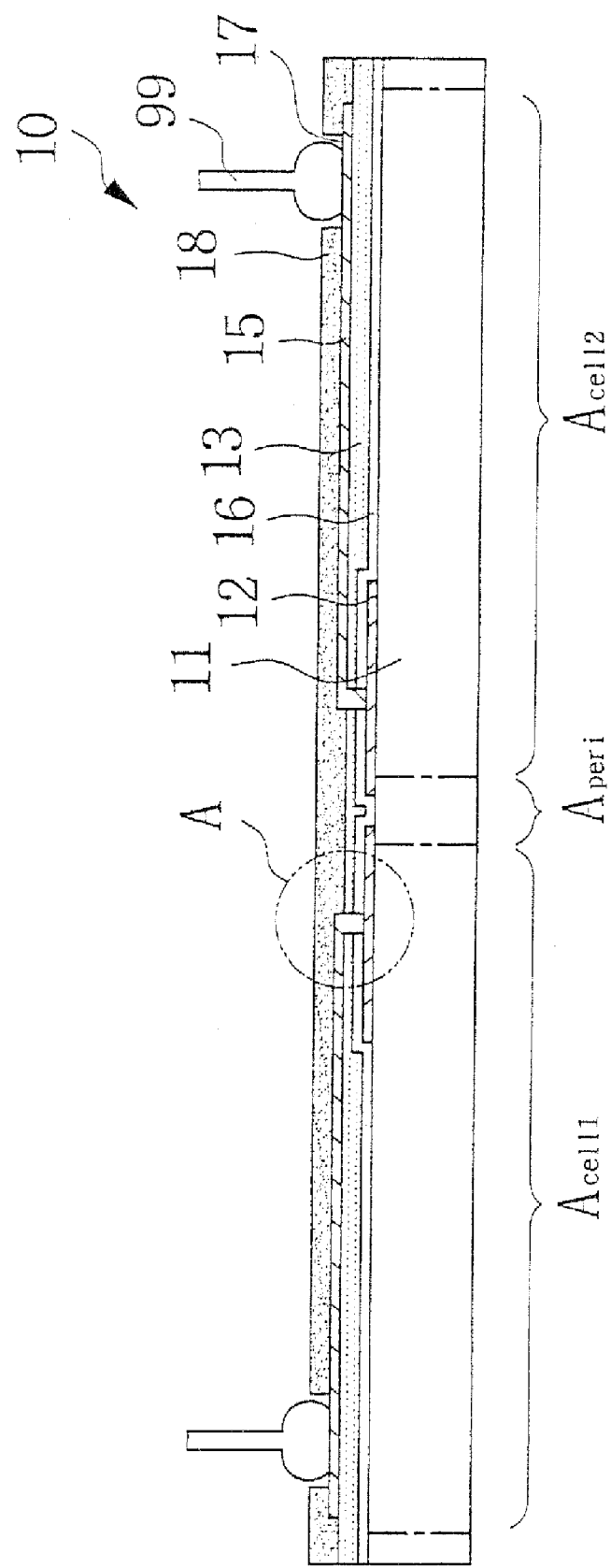
FIG. 11 is a cross-sectional view of the semiconductor chip of FIG. 9, following wire bonding.

Referring to FIG. 11, electrical connection means such as bonding wires 99 are coupled to the bond pads 17. If necessary, the positions of bond pads 17 can be adjusted depending on the design and structure of the electrical interconnections.

As described above, the bond pads 17 of this embodiment are preferably formed over at least a part of the cell regions of the substrate 11. Therefore, the peripheral circuit region $A_{peri}$ has a much smaller width than that of the conventional peripheral circuit region. Thus, the total width of the semiconductor chip 10 can be reduced. The widths of the cell regions $A_{cell}^1$ and $A_{cell2}$ may be the same as that of the conventional cell region. Of course, the total thickness of the semiconductor chip 10 increases due to the formation of the pad-rearrangement pattern 15 and the insulating layer 18 above the cell regions $A_{cell1}$ or $A_{cell2}$. The increased percentage in total thickness of the chip 10 is no more than the reduced percentage of the total width of the chip 10.

The total size of the chip 10 can be therefore reduced.

A method of manufacturing the above-described semiconductor chip 10 will now be described. Referring to FIG. 5, a semiconductor substrate 11 includes on-chip circuits formed on the cell regions $A_{cell1}, A_{cell2}$ and the peripheral circuit region $A_{peri}$. If the semiconductor chip 10 is a memory device, the circuits formed on the cell regions $A_{cell1}$, $A_{cell2}$ are memory cells having MOS transistors and capacitors, while the circuits formed on the peripheral circuit region include, for example, address decoding circuits and data input/output buffers for the memory cells. Thus, the structure and/or function of devices formed on the cell regions $A_{cell1}$, $A_{cell2}$ of the substrate 11 is different from the structure and/or function of devices formed on the peripheral circuit region $A_{peri}$ of the substrate 11. The bond pad-wiring pattern 12 is formed on the substrate 11 to be selectively connected to the integrated circuits. The passivation layer 16 is then formed on the bond pad-wiring pattern 12. The bond pad-wiring pattern 12 is formed in a predetermined layout using conventional techniques such as chemical vapor deposition (CVD) or physical vapor deposition (PYD) including sputtering. As described above, although the bond pad-wiring pattern 12 can be formed on both the cell regions $A_{cell1}$, $A_{cell2}$ and the peripheral circuit region $A_{peri}$, the bond pad-wiring pattern may be formed on just the cell regions $A_{cell1}$, $A_{cell2}$ (not shown).

Next, as shown in FIG. 6, the ILD 13 is formed on the passivation layer 16. Openings 14 are formed extending through the passivation layer 16 and the ILD 13 to expose predetermined portions of the bond pad-wiring pattern 12. The ILD 13 is made of a material such as HDP-SiO$_2$ having good integration and insulating qualities. The integrated circuits under the ILD 13 can therefore be protected from physical stresses during the formation of electrical interconnections. The ILD 13 also helps planarize the underlying structure. The openings 14 can be formed above either the cell regions $A_{cell1}$, $A_{cell2}$ or the peripheral circuit region $A_{peri}$.

Figure 12:
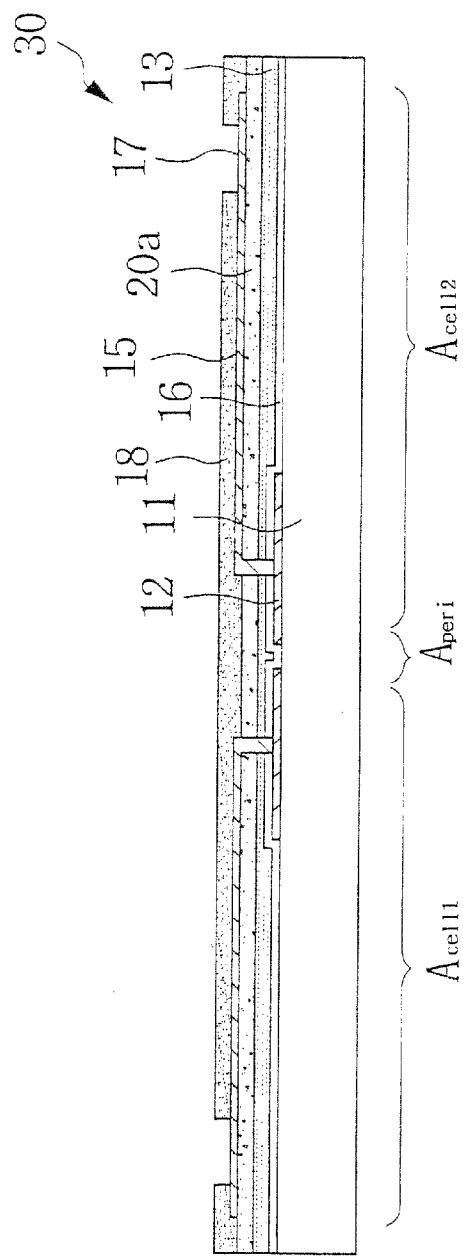
FIG. 12 is a cross-sectional view illustrating a semiconductor chip according to another embodiment of the present invention.
Figure 17:
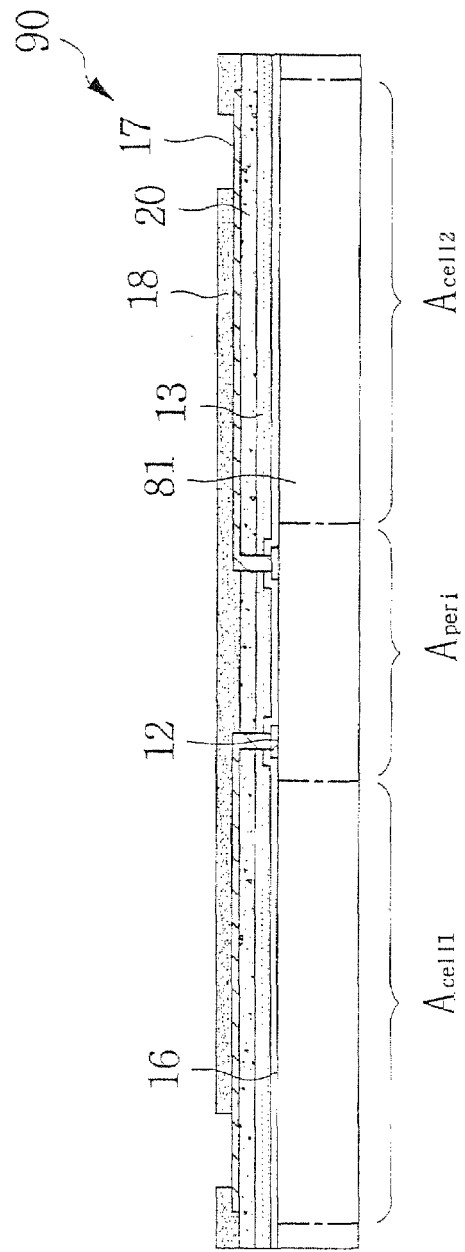
FIG. 17 is a cross-sectional view of a semiconductor chip according to a still further embodiment of the present invention.

Although the forgoing embodiment comprises a single ILD, the present invention may comprise two or more ILDs, as shown in FIG. 12 and FIG. 17. Referring to FIGS. 12 and 17, second ILDs 20a, 20 can be interposed between the ILD 13 and the pad-rearrangement pattern 15. In particular, as illustrated in FIGS. 12 and 17, because the second ILDs 20a, 20 are interposed between the ILD 13 and the pad-rearrangement pattern 15, the electrical properties of the semiconductor chips 30, 90 are improved. The capacitance, for example, can be lowered. The thickness of the second ILD 20a is between 2 to 50 μm, for example determined base on the capacitance and the intensity supplement. The second ILD 20a may be made of benzocyclobutene (BCB), polybenzoxazole (PBO), polyimide, and so on. Also, in this case, the planarization process is preferably performed on the ILDs to improve the planarity of the ILDs 13, 20a or 20. Accordingly, the planarity of the pad-rearrangement pattern 15 thereon can be in turn improved. Further, connection failures of the bonding wires or the beam leads on the bond pads 17 are prevented and the adhesion therebetween are improved. The planarization is preferably accomplished through chemical and mechanical polishing (CMP).

According to one aspect of the present invention, the ILDs 13 and 20 of the semiconductor chip 90 (FIG. 17) distribute mechanical stresses during the formation of the electrical interconnections and protect the bond pads 17 from the mechanical stresses. In addition, since the bond pads 17 are formed after two planarization processes on the two ILDs, the bonding stability of the wire bonding between the bond pads 17 and the external device is improved.

Figure 1:
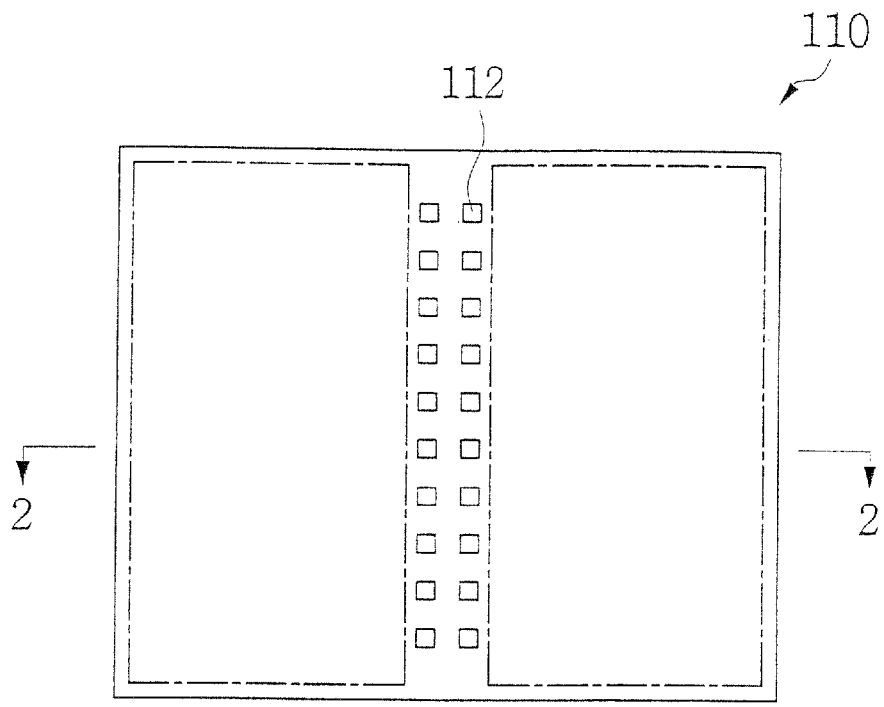
FIG. 1 is a plan view of a conventional center pad-type semiconductor chip.
Figure 3:
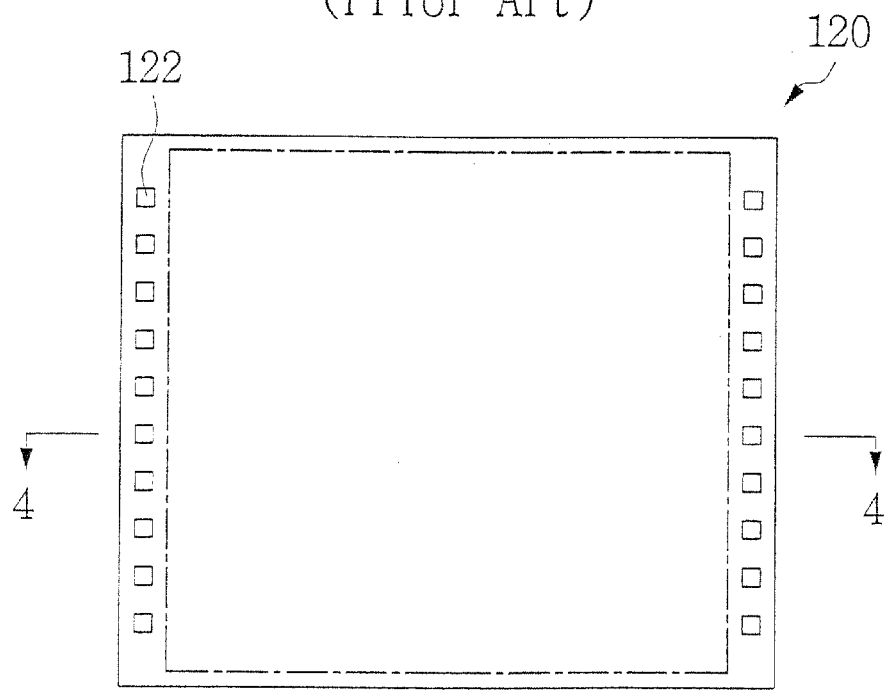
FIG. 3 is a plan view of a conventional peripheral pad-type semiconductor chip.
Figure 2:
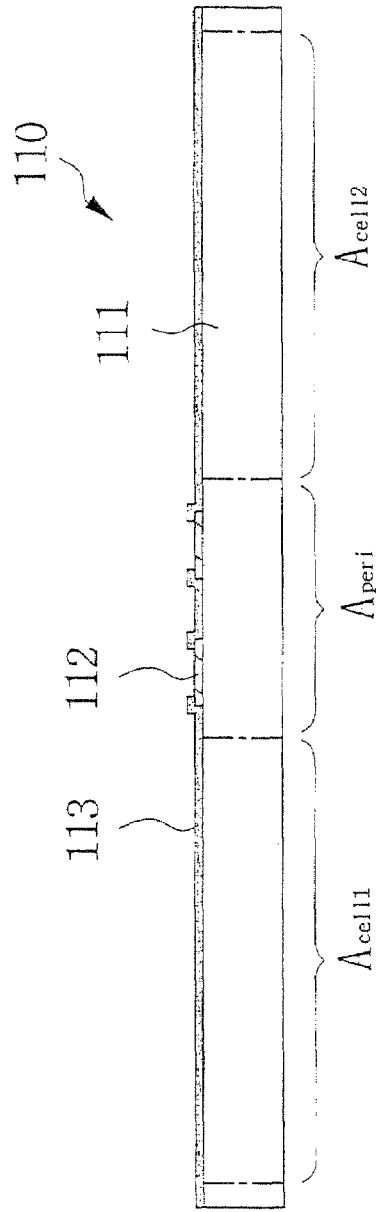
FIG. 2 is a cross-sectional view of the conventional center pad-type taken along the line 2-2 of FIG. 1.
Figure 4:
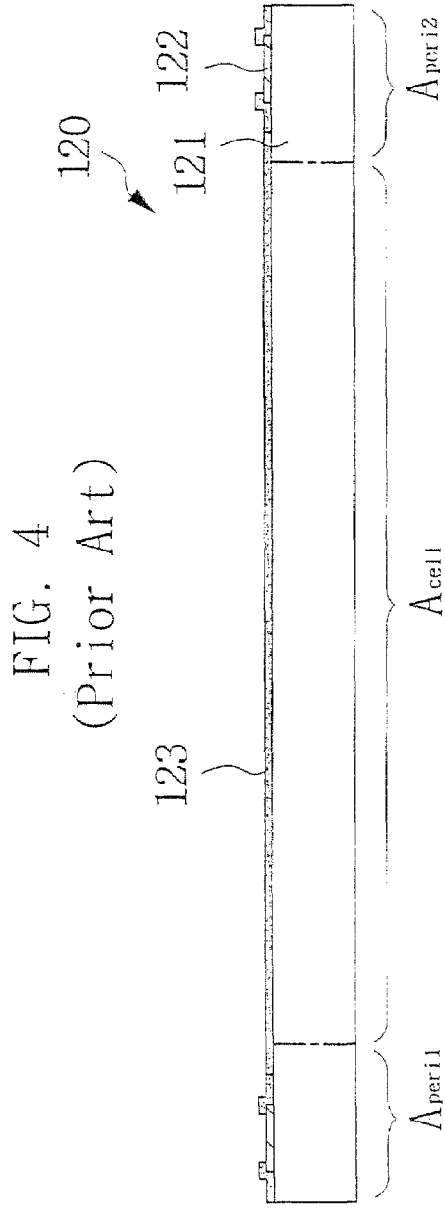
FIG. 4 is a cross-sectional view of the peripheral pad-type chip taken along the line 4-4 of FIG. 3.
Figure 7:
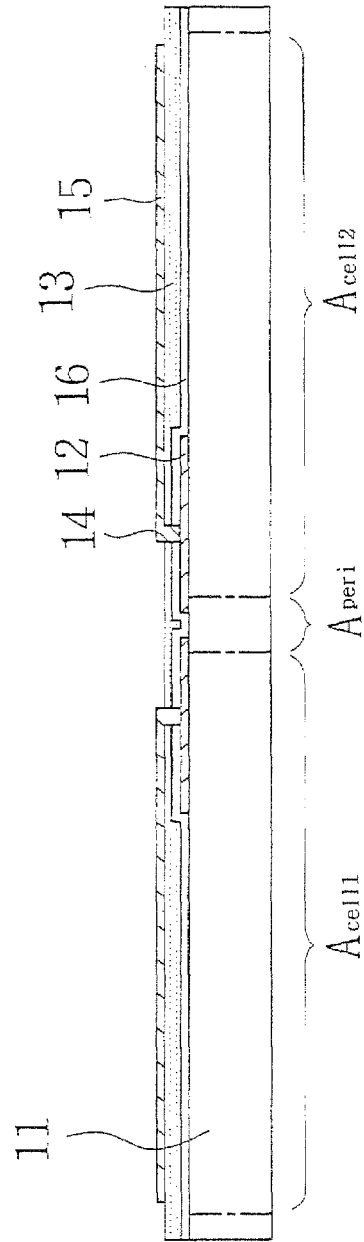

Referring to FIG. 7, the pad-rearrangement pattern 15 is formed on the ILD 13. The pad-rearrangement pattern 15 fills the openings 14 and is electrically connected to the bond pad-wiring pattern 12. The pad-rearrangement pattern 15 is obtained in a desired layout using CVD or sputtering, for example.

Referring to FIG. 8, an insulating layer 18 is formed on the pad-rearrangement pattern 15 and includes an opening 19 to expose predetermined portions of the pad-rearrangement pattern 15. The exposed portions of the pattern 15 are defined as the bond pads 17. The insulating layer 18 is preferably made of HDP-SiO$_2$ to protect the integrated circuits from mechanical stresses. The insulating layer 18 may further comprise a polyimide layer on the HDP-SiO$_2$ layer to protect the integrated circuits from alpha particles. The ILD 20a and the insulating layer 18 can alternatively made of polyimide.

Figure 13:
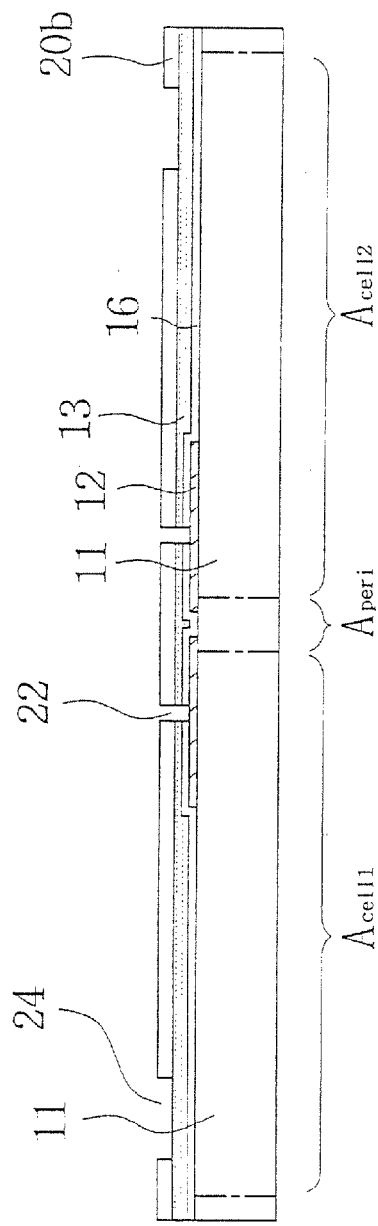

FIGS. 13 through 15 are cross-sectional views of a semiconductor chip illustrating a process of manufacturing a semiconductor chip in accordance with another embodiment of the present invention. In this embodiment, as shown in FIG. 15, a semiconductor chip 50 comprises a second ILD 20b on a first ILD 13. Bond pads 17 of this embodiment, however, are formed on the first ILD 13. In order to prevent a cushioning effect due to the mechanical stress of the electrical interconnections, portions of the second ILD 20b under the bond pads 17 are removed.

In particular, Referring to FIGS. 13 through 15, a semiconductor substrate 11 includes a bond pad-wiring pattern 12 preferably formed on at least a portion of the peripheral circuit region $A_{peri}$ and electrically connected thereto. A passivation layer 16 is formed on the semiconductor substrate 11 and on the bond pad-wiring pattern 12. The first ILD 13 is formed over the semiconductor substrate 11 including the bond pad-wiring pattern 12. A second ILD 20b is then formed over the first ILD 13. A first opening 22 is formed through the first and second ILDs 13, 20b and the passivation layer 16 to expose a portion of the bond pad-wiring pattern 12. A second opening 24 is formed through the second ILD 20b to expose a portion of the first ILD 13. A pad-rearrangement pattern 15 is formed over the second ILD 20b and within the first opening 22 and is electrically connected to the bond pad-wiring pattern 12. The pad-rearrangement patter 15 is also formed within the second opening 24. An insulating layer 18 is formed over the pad-rearrangement pattern 15 and includes an opening 26 therein that exposes a portion of the pad-rearrangement pattern 15 formed within the second opening 24 to define the bond pads 17 over at least a part of the cell region $A_{cell}$. The portions of the pad-rearrangement pattern 15 not covered by the insulating layer 18 provide the bond pads 17. This embodiment has the similar features as described previously. For example, the bond pad-wiring pattern 12 is formed substantially in a center region of the semiconductor substrate 11.

Figure 18:
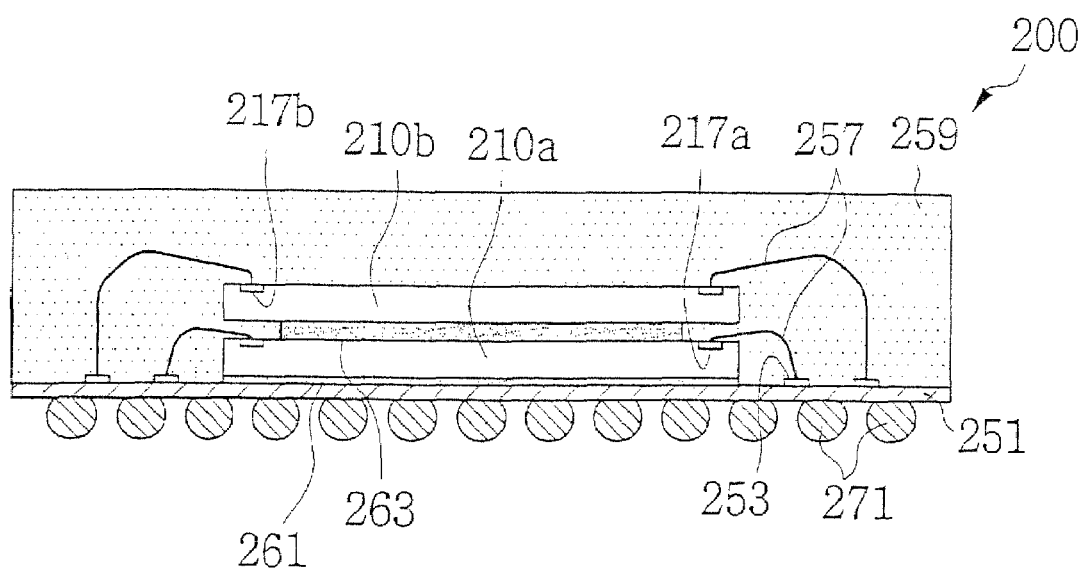
FIG. 18 is a cross-sectional view of an MCP according to another embodiment of the present invention.

Various MCPs utilizing the semiconductor chips according to the embodiments of the present invention are obtainable, which will be explained below. Referring to FIG. 18, an MCP 200 preferably comprises a first chip 210a and a second chip 210b that are vertically stacked on a package substrate 251. A printed circuit board (PCB) or tape wiring substrate can be used as the package substrate 251. The substrate surface preferably has a plurality of bonding tips 253 formed thereon. The first and second chips 210a and 210b are preferably the same type of chips. The first and second chips 210a and 210b can have structures formed in accordance with the principles of the present invention described previously. For example, a bond pad-wiring pattern can be formed substantially in a center region of a semiconductor substrate, for example. Accordingly, the bond pads 217a and 217b of the first and second chips 210a and 210b are formed over cell regions along sides of the chips 210a and 210b. Thus, the chips 210a and 210b can have a modified configuration, i.e., a center pad-type chip can be modified into a peripheral pad-typed chip.

The first and second chips 210a and 210b are electrically connected to the package substrate 251 by electrical connection means such as bonding wires 257, which are in turn electrically connected to the bonding tips 253. Thus, each bonding tip 253 is electrically connected to a corresponding one of the bond pads 271a, 271b.

The first chip 210a is mounted on the package substrate 251 with an adhesive 261, and the second chip 210b is mounted on the first chip 210a with an adhesive material 263. The adhesive material 263 is interposed between the first and second chips 210a and 210b, thus ensuring enough space for the bonding wires 257 used in connecting the first chip 210a with the package substrate 251.

An encapsulant 259, formed of a material such as an epoxy molding compound, protects the upper surface of the package substrate 251 from an external environment by encapsulating the first and second chips 210a, 210b and the bonding wires 257. Solder balls 271 are formed on the lower surface of the package substrate 251 to provide external connection terminals.

As described above, since the MCP 200 according to this embodiment includes multiple semiconductor chips in a single package body, the principles of the present invention can be used to increase memory capacity as well as the number of input/output pins without complicated assembly processes.

Figure 19:
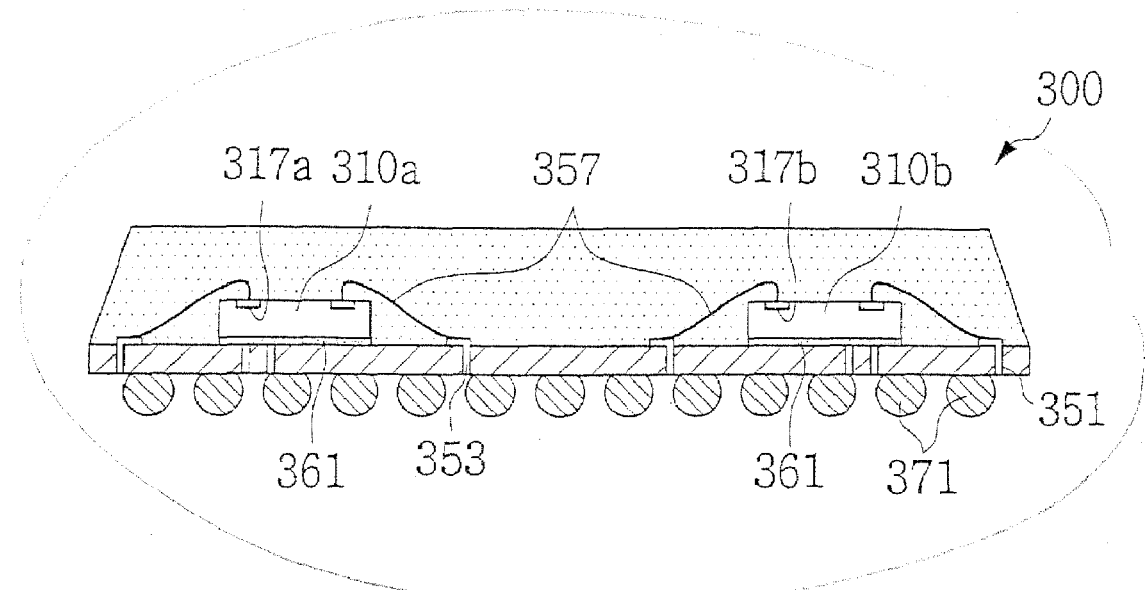
FIG. 19 is a cross-sectional view of an MCP according to another embodiment of the present invention.

Referring to FIG. 19, an MCP 300 according to another embodiment of the present invention comprises a first chip 310a and a second chip 310b mounted side by side on a package substrate 351. Here, the first and second chips 310a, 310b preferably have structures the same as or similar to the structures described in FIG. 21 or the same as or similar to structures of the chip embodiments described above. For example, the first and second chips 310a, 310b are preferably electrically connected to the substrate 351 by bonding wires 357 through bonding tips 353. Reference numerals 359, 361, 371 are used herein to denote an encapsulant, adhesives, and solder balls, respectively.

Figure 20:
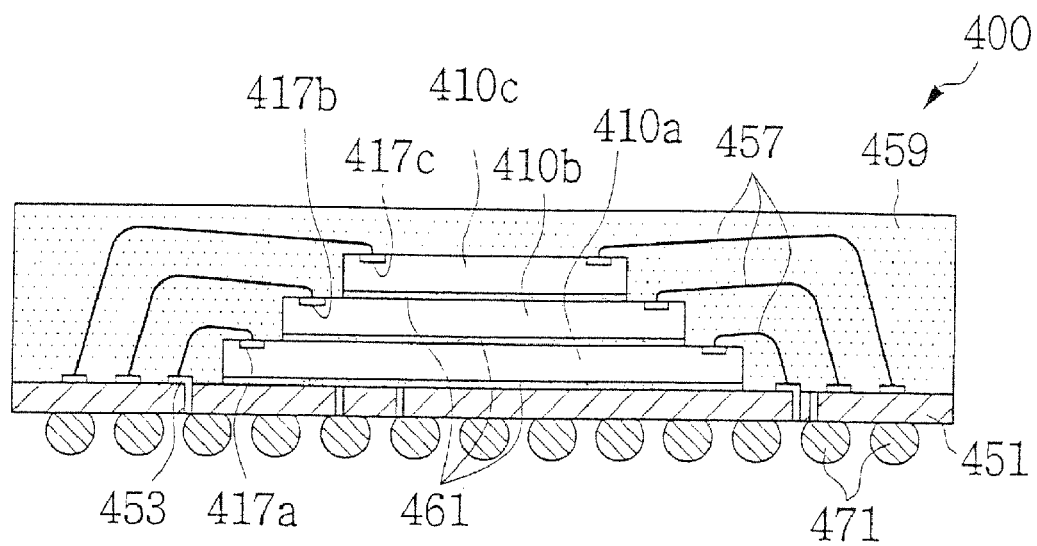
FIG. 20 is a cross-sectional view of an MCP according to yet another embodiment of the present invention.

Referring now to FIG. 20, an MCP 400 according to yet another embodiment of the present invention comprises three semiconductor chips 410a, 410b, 410c that are stacked sequentially on a package substrate 451. The chips 410a, 410b, 417c preferably have structures similar to structures described previously in accordance with the principles of the present invention. For example, the semiconductor chips 410a, 410b, 410c are preferably peripheral pad-type chips having realignment bond pads 417a, 417b, 417c formed over cell regions along a periphery (or sides) thereof. The semiconductor chips 410a, 410b, 410c can have different widths from each other. For example, the semiconductor chips 410a, 410b, 410c are preferably stacked in order of size, i.e., from the largest chip 410a to the smallest chip 410c. Different configurations are possible, however, depending on applications. For example, any two of the chips 410a, 410b, 410c may have the same width.

The semiconductor chips 410a, 410b, 410c are preferably electrically connected to the substrate 451 by bonding wires 457 through bonding tips 453. As described above, the MCP 400 of this embodiment can comprise different types of chips. Since the center pad-type chip is modified into a peripheral pad-type chip, it is possible to vertically stack the multiple chips and the lengths of the bonding wires can be made shorter to allow easier wire bonding.

Figure 21:
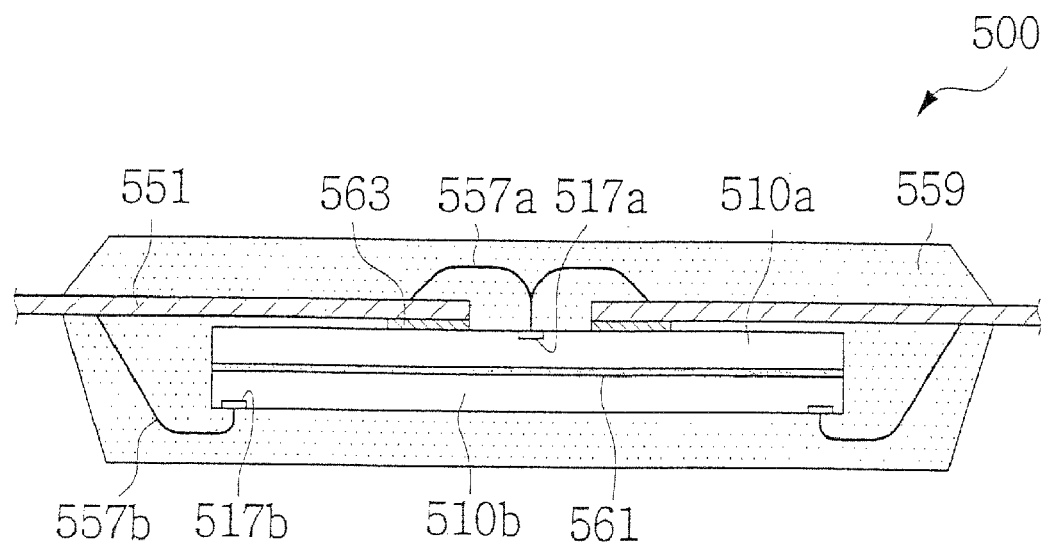
FIG. 21 is a cross-sectional view of an MCP according to a further embodiment of the present invention.

Turning to FIG. 21, an MCP 500 according to yet another embodiment of this invention is a dual die package (DDP) comprising first and second semiconductor chips 510a, 510b. A lead frame 551 is used to mount the chips 510a, 510b. The second semiconductor chip 510b is preferably formed in accordance with the principles of the present invention described above. For example, the second semiconductor chip 510b can be a peripheral pad-type chip having a realignment bond pad 517b formed on the peripheral circuit region along sides of the chips 510a, 510b. In contrast, the first semiconductor chip 510a preferably has a center pad-type bond pad 517a.

The MCP 500 of this embodiment does not include die pads for mounting the semiconductor chips 510a, 510b. Instead, the leads of the lead-frame 551 employed in the LOC type package are preferably used. The length of the leads of the lead frame 551 is preferably longer than that of the conventional leads, but this is not required. The upper surface of the first semiconductor chip 510a is attached to lower surfaces of opposing leads of the lead frame 551 by adhesive tape 563. The bond pad 517a of the first chip 510a is disposed between the opposing leads of the lead frame 551 and is wire-bonded to the upper surface of the corresponding leads of the lead frame 551 by bonding wires 557a. The upper surface of the second chip 510b is attached to the lower surface of the first chip 510a with an adhesive 561. The realignment bond pad 517b of the second chip 510b is wire-bonded to the lower surface of the corresponding leads of the lead frame 551 by bonding wires 557b. The first and second chips 510a, 510b and corresponding bonding wires 557a, 557b are encapsulated by an encapsulant 559.

In summary, the MCP 500 is a DDP comprising semiconductor chips modified from a center pad-type into a peripheral pad-type or vice versa. In addition, with the MCP 500, larger semiconductor chips can be used as compared to the other embodiments described previously.

Figure 22:
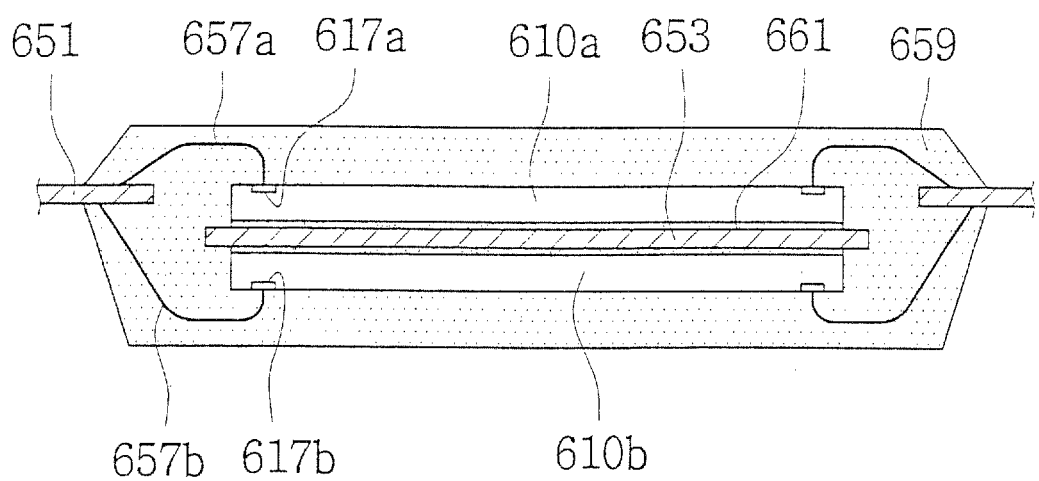
FIG. 22 is a cross-sectional view of an MCP according to a still further embodiment of the present invention.

Referring to FIG. 22, an MCP 600 according to a still further embodiment of the invention is a DDP comprising first and second semiconductor chips 610a, 610b. A die pad 653 and leads 651 are used for mounting the chips 610a, 610b. The first and second chips 610a, 610b are preferably a peripheral pad-type where bond pads 617a, 617b are formed along sides of the chips 610a, 610b. The first and second chips 610a, 610b are attached to the upper and lower surfaces, respectively, of the die pad 653 with an adhesive 661. The bond pads 617a of the first chip 610a are wire-bonded to the upper surfaces of the leads 651 by bonding wires 657a. The bond pads 617b of the second chip 610b are wire-bonded to the lower surfaces of the leads 651 by bonding wires 657b. The first and second chips 610a, 610b and bonding wires 657a, 657b are encapsulated by an encapsulant 659.

The MCP 600 of this embodiment comprises chips formed in accordance with the previously-described principles of the present invention. For example, the MCP 600 can comprise semiconductor chips modified from a center pad-type into a peripheral pad-type.

Figure 23:
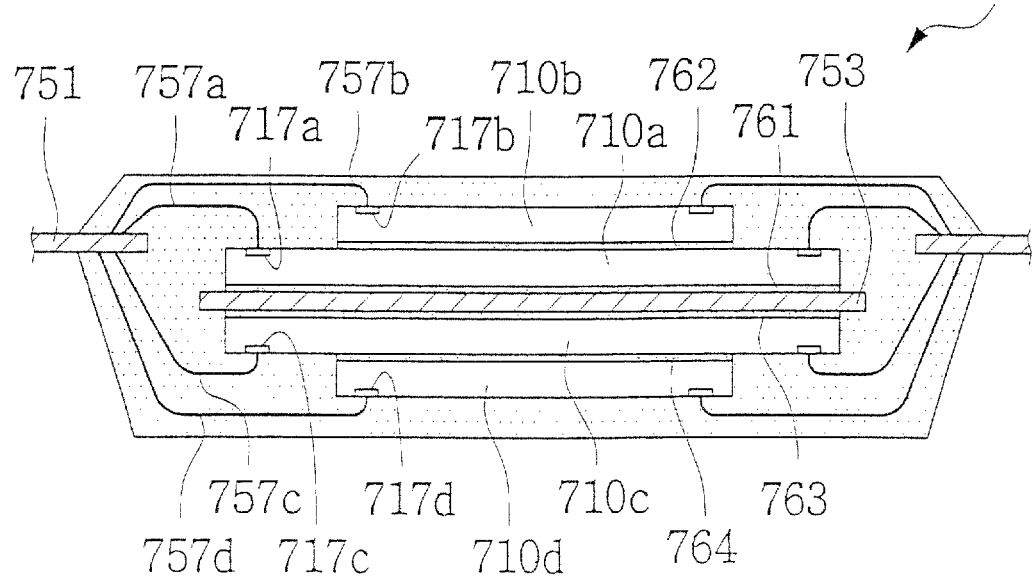
FIG. 23 is a cross-sectional view of an MCP according to a still further embodiment of the present invention.

Referring to FIG. 23, an MCP 700 according to a further embodiment of the present invention includes four semiconductor chips 710a, 710b, 710c, 710d. Preferably, a width of a first chip 710a is substantially greater than a width of a second chip 710b. Also, a width of a third chip 710c is preferably substantially greater than a width of a fourth chip 710d. The width of the first chip 710a is also preferably approximately equal to the width of the third chip 710c. A person skilled in the art will appreciate, however, that the widths of the first and third chips 710a, 710c, or the second and fourth chips 710b, 710d need not necessarily be equal, but may be made different depending on a desired application.

A lead frame 751 having a die pad 753 is used to mount the chips 710a, 710b, 710c, 710d. The non-active surface of the first chip 710a is attached to the upper surface of the die pad 753. The non-active surface of the second chip 710b is attached to a portion of the active surface of the first chip 710a. The non-active surface of the third chip 710c is attached to the lower surface of the die pad 753. The non-active surface of the fourth chip 710d is attached to a portion of the active surface of the third chip 710c. The first and second chips 710a, 710b preferably face upwardly and the third and fourth chips 710c, 710d preferably face downwardly.

The bond pads 717a, 717b of the first and second chips 710a, 710b are wire-bonded to the upper surface of the lead of the lead frame 751 through first and second bonding wires 757a, 757b, respectively. The bond pads 717c, 717d of the third and fourth chips 710c, 710d are wire-bonded to the lower surface of the lead of the lead frame 751 by third and fourth bonding wires 757c, 757d, respectively. The semiconductor chips 710a, 710b, 710c, 710d and bonding wires 757a, 757b, 757c, 757d are encapsulated with an encapsulant 753. Herein, the reference numerals 761, 762, 763, and 764 each represent an adhesive.

In various embodiments of the present invention, such as those described previously, electrical connections between the chips and the lead frame or package substrate are preferably made by wire bonding. Other techniques may be used instead, however, to form an MCP according to the present invention.

Also, a person skilled in the art will appreciate that other types of lead frames or tape can be used different from the lead frames illustrated in the accompanying figures. For example, the lead frames have inner leads bent twice and outer leads are J-leaded. In this case, the bent portion of the inner leads overlies on the active surface of one of plural chips and attached thereto by an adhesive tape or other suitable adhesives.

Although the MCPs of the various preferred embodiments of the present invention are illustrated as including between two and four semiconductor chips in a single MCP body, other numbers of chips can be incorporated in an MCP depending on the desired application.

The chips can be all the same type of chip, such as memory chips, for example. As another example, one of the chips can be a DRAM and the other can a flash memory. Alternatively, the chips can be of different types. For example, one of the chips can be a memory chip such as a flash memory, a static random access memory (SRAM), or a dynamic random access memory (DRAM), and another chip can be a non-memory chip such as a microprocessor. The present invention can therefore be used to implement a system in a package (SIP) and thereby significantly increase packing density.

Although various preferred embodiments of the present invention have been disclosed herein for illustrative purposes, those skilled in the art will appreciate that various modifications, additions, and substitutions are possible without departing from the scope and spirit of the invention as provided in the accompanying claims.

What is claimed is:

1. A semiconductor chip having one or more peripheral bond pads, the semiconductor chip comprising:
    a semiconductor substrate having a cell region and a peripheral circuit region adjacent to each other;
    a bond pad-wiring pattern formed on at least a part of the peripheral circuit region of the semiconductor substrate;
    a passivation layer formed on the bond pad-wiring pattern and exposed portions of the semiconductor substrate;
    a pad-rearrangement pattern disposed over the passivation layer and electrically connected to the bond pad-wiring pattern; and
    an insulating layer formed over the pad-rearrangement pattern, the insulating layer having an opening therein that exposes a portion of the pad-rearrangement pattern to define a bond pad, the bond pad disposed over at least a part of the cell region.

2. The semiconductor chip of claim 1, wherein the bond pad-wiring pattern is disposed on an outer edge of a surface of the semiconductor chip.

3. The semiconductor chip of claim 1, wherein at least a portion of the pad-rearrangement pattern extends from the peripheral circuit region of the semiconductor substrate toward the cell region of the semiconductor substrate.

4. The semiconductor chip of claim 1, wherein at least a portion of the bond pad-wiring pattern is formed on at least a part of the cell region.

5. A method of forming a semiconductor chip having one or more peripheral bond pads, the method comprising:
    forming a semiconductor substrate having a cell region and a peripheral circuit region adjacent to each other;
    forming a bond pad-wiring pattern on at least a part of the peripheral region of the semiconductor substrate, while exposing portions of the semiconductor substrate;
    forming a passivation layer on the bond pad-wiring pattern and exposed portions of the semiconductor substrate; and
    forming a pad-rearrangement pattern over the passivation layer, the pad-rearrangement pattern in electrical communication with the bond pad-wiring pattern, the pad-rearrangement pattern including at least one bond pad portion disposed over at least a part of the cell region.

6. The method of claim 5, which further comprises forming an insulating layer over the pad-rearrangement pattern, the insulating layer having an opening therein to expose at least a portion of the pad-rearrangement pattern to define the bond pad.

7. The method of claim 5, wherein at least a portion of the pad-rearrangement pattern extends from the peripheral circuit region of the semiconductor substrate toward the cell region of the semiconductor substrate.

8. The method of claim 5, wherein at least a portion of the bond pad-wiring pattern is formed on at least a part of the cell region.

9. The method of claim 8, wherein at least a portion of the bond pad-wiring pattern is disposed on an outer edge of a surface of the semiconductor chip.

10. The semiconductor chip of claim 1, further comprising at least one of an address decoding circuit and a data input/output buffer formed on the peripheral circuit region of the semiconductor substrate.

11. The semiconductor chip of claim 10, further comprising a memory cell formed on the cell region of the semiconductor substrate.

12. The semiconductor chip of claim 11, wherein the memory cell comprises a transistor and a capacitor.

13. The semiconductor chip of claim 1, wherein a portion of the passivation layer overlaps at least a portion of the cell region of the semiconductor substrate and not the peripheral circuit region of the semiconductor substrate.

14. The semiconductor chip of claim 1, wherein a portion of the passivation layer overlaps at least a portion of the peripheral circuit region of the semiconductor substrate and not the cell peripheral circuit region of the semiconductor substrate.

* * * * *